United States Patent
Lane et al.

(10) Patent No.: US 7,890,067 B2
(45) Date of Patent: Feb. 15, 2011

(54) LINEAR RF AMPLIFIER WITH POLAR FEEDBACK

(75) Inventors: John R. Lane, Forest, VA (US); William P. Overstreet, Lynchburg, VA (US)

(73) Assignee: Pine Valley Investments, Inc., Las Vegas, NV (US)

( * ) Notice: Subject to any disclaimer, the term of this patent is extended or adjusted under 35 U.S.C. 154(b) by 869 days.

(21) Appl. No.: 11/801,444

(22) Filed: May 10, 2007

(65) Prior Publication Data

US 2008/0280573 A1    Nov. 13, 2008

(51) Int. Cl.
*H04B 1/04* (2006.01)

(52) U.S. Cl. .................. 455/126; 455/127.2

(58) Field of Classification Search .......... 455/126, 455/102, 110, 111, 112, 114.2, 114.3, 118, 455/124, 125, 127.1, 127.2; 330/260, 291
See application file for complete search history.

(56) References Cited

U.S. PATENT DOCUMENTS

| | | | |
|---|---|---|---|
| 4,618,999 A * | 10/1986 | Watkinson | 455/108 |
| 4,630,315 A * | 12/1986 | Watkinson | 455/109 |
| 6,043,707 A | 3/2000 | Budnik | |
| 6,653,909 B2 * | 11/2003 | Nielsen | 332/151 |
| 7,072,626 B2 * | 7/2006 | Hadjichristos | 455/126 |
| 7,570,928 B2 * | 8/2009 | Magoon et al. | 455/102 |

| | | | |
|---|---|---|---|
| 2007/0037530 A1 * | 2/2007 | Peckham et al. | 455/102 |
| 2007/0287393 A1 * | 12/2007 | Nandipaku et al. | 455/127.1 |
| 2007/0298734 A1 * | 12/2007 | Woo et al. | 455/114.3 |

FOREIGN PATENT DOCUMENTS

| | | |
|---|---|---|
| EP | 1 011 192 A2 | 6/2005 |
| WO | WO 00/72438 A1 | 11/2000 |

OTHER PUBLICATIONS

International Search Report, International Application No. PCT/US2008/005886, International Filing Date Aug. 5, 2008.

* cited by examiner

*Primary Examiner*—Blane J Jackson
(74) *Attorney, Agent, or Firm*—Allen, Dyer, Doppelt, Milbrath & Gilchrist, P.A.

(57) ABSTRACT

A system for power amplification of an RF signal including polar feedback control. The system may include a feedback-controlled modulator configured to modulate an RF signal based on a feedback-corrected control signal. The modulator is further configured to generate a modulated RF signal. The system also may include a phase shifter configured to correct the phase of the modulated RF signal based on a feedback phase control signal. The system further includes a power amplifier in communication with the modulator and/or the phase shifter. The amplifier is configured to amplify the modulated RF signal and to generate an amplified RF output signal. The system also includes a feedback network configured to generate polar feedback signals, including the feedback-corrected control signal and/or the feedback phase control signal.

13 Claims, 13 Drawing Sheets

LINEAR RF AMPLIFIER WITH POLAR FEEDBACK

FIELD OF THE INVENTION

The invention relates generally to systems for linear amplification of radio-frequency (RF) signals and, more particularly, to systems for linear amplification of RF signals using polar feedback.

BACKGROUND OF THE INVENTION

A variety of applications, including many forms of wireless communications, employ radio-frequency (RF) transmissions. For example, an RF carrier wave may be modulated with a baseband signal containing information to be communicated. The modulated RF signal may then be amplified and transmitted. A certain degree of care must be taken in the amplification of the RF signal to ensure that it is not distorted. If the RF transmission is distorted, a receiver may not be able to properly demodulate the RF signal and recover the original baseband signal.

To avoid distortion, the amplification process must remain relatively linear. One way of accomplishing this is to use a highly backed-off amplifier (i.e., an amplifier operated well below its maximum power capacity). By backing off the amplifier, it may be operated in a relatively linear fashion. However, amplifiers typically operate very inefficiently when backed off far from their maximum capacity.

Another way to avoid distortion is to use feedback to correct for nonlinearities in the amplified RF signal. The principal of feedback, specifically negative feedback, has been known for decades. High-fidelity audio amplifiers typically use large amounts of negative feedback to reduce audible distortion to very low levels. In principal, direct negative feedback (in which the output is connected back to the input via a passive feedback network) can also be applied to RF amplifiers. However, very high system gain is required to obtain significant linearization. It is relatively easy to obtain high system gain at audio frequencies, but it is not so easy at radio frequencies. As a result, the use of direct negative feedback has been limited in RF power amplifiers, and has provided only marginal results.

As an alternative to direct negative feedback of an RF signal, the RF signal may be converted to baseband (i.e., a low-frequency signal, similar to audio frequencies) at which high gain may be obtained. The highly amplified baseband signal may then be converted back to RF and applied to the input of an RF amplifier. This process requires demodulating the signal from RF to baseband and then modulating the amplified baseband signal back to RF.

In a Cartesian feedback system, the demodulation process produces "in-phase" and "quadrature," or "IQ" signals. Cartesian feedback system are sensitive to operating conditions such as temperature and require IQ demodulators and modulators with very tightly controlled phase characteristics. To control the phase characteristics properly, Cartesian feedback requires a complex auxiliary control system that is difficult to implement and adjust. In addition, systems employing Cartesian feedback typically are expensive and complex. As a result, Cartesian feedback is not desirable for certain types of RF applications, such as two-way radio communication.

Accordingly, there is a need for efficient systems for linear amplification of RF signals. In addition, there is a need for relatively simple, inexpensive linear RF amplification systems.

BRIEF SUMMARY

According to one aspect of the invention, there is a system for power amplification of an RF signal. The system includes a feedback-controlled modulator configured to modulate an RF signal based on a feedback-corrected control signal. The modulator is further configured to generate a modulated RF signal. The system further includes a power amplifier in communication with the modulator. The amplifier is configured to amplify the modulated RF signal and to generate an amplified RF output signal. The system also includes an amplitude detector in communication with the power amplifier. The amplitude detector is configured to detect an amplitude characteristic of the amplified RF output signal and to generate an amplitude feedback signal. The system includes a feedback network in communication with the amplitude detector and the modulator. The feedback network is configured to generate a feedback-corrected control signal based on the difference between the amplitude feedback signal and an amplitude component of the original waveform.

According to another aspect of the invention, there is a system for power amplification of an RF signal including polar phase feedback control. The system includes a phase shifter configured to generate a phase-corrected RF signal based on a complete modulated RF signal. A power amplifier is in communication with the phase shifter. The power amplifier is configured to amplify the phase-corrected RF signal and to generate an amplified RF output signal. A polar feedback network is in communication with the amplifier and the phase shifter. The polar feedback network is configured to provide a feedback phase control signal based on a phase component of the amplified RF output signal. The phase shifter is further configured to correct the phase of the modulated RF signal based on the feedback phase control signal.

Other methods, apparatus, systems, features, and advantages of the invention will be, or will become, apparent to one with skill in the art upon examination of the following figures and detailed description. It is intended that all such additional systems, methods, features and advantages be included within this description.

BRIEF DESCRIPTION OF THE DRAWINGS

The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PRESENTLY PREFERRED EMBODIMENTS

Embodiments of the invention include systems for power amplification of an RF signal, including amplifiers, transmitters, etc. The embodiments described in this application may be implemented in a wide range of applications, such as, for example, two-way radios, simulcast communication systems, and mobile telephones.

Figure 1:
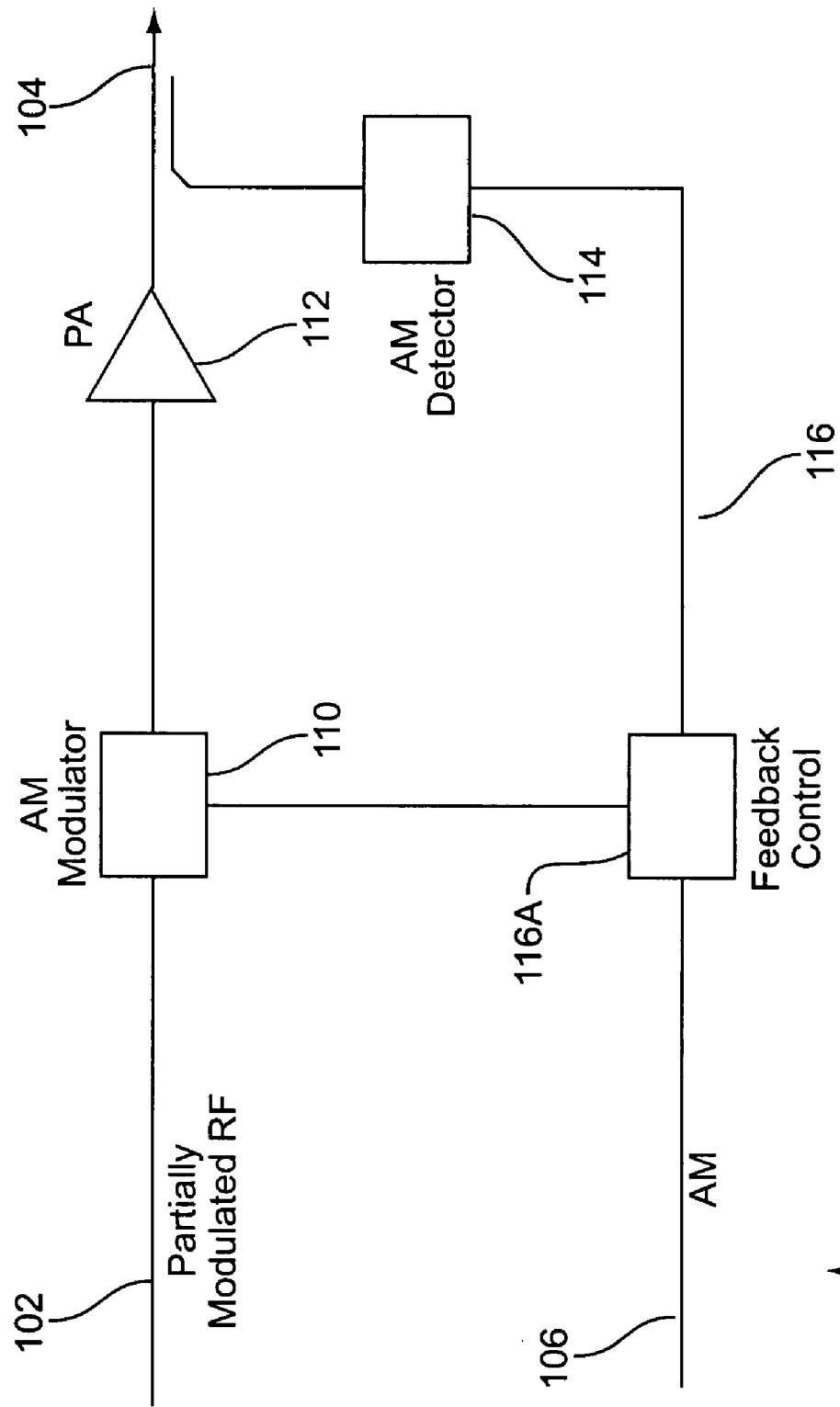
FIG. 1 is a block diagram illustrating a system for power amplification of an RF signal using polar feedback according to one aspect of the invention.

FIG. 1 is a block diagram illustrating a system 100 for linear amplification using polar amplitude feedback according to one aspect of the invention. Polar amplitude feedback is provided based on the magnitude channel of a polar feedback network. The system 100 modulates and amplifies an RF signal 102 to generate an output signal 104. The modulation is provided by an amplitude modulator 110, and the amplification is provided by a power amplifier 112. The amplitude modulator 110 and the power amplifier 112 may take any suitable form, depending on the particular application. For example, the modulation and amplification functions may be combined into a single device or distributed among many devices. In addition, the power amplifier 112 (or power amplifiers) need not be linear in operation. The system 100 includes a polar amplitude feedback network 116 to correct for any distortion or nonlinearities introduced by the power amplifier 112.

An amplitude detector 114 senses the amplitude component of the output signal 104 independent of any phase component. For example, the amplitude detector 114 may be a signal envelope detector. The amplitude detector 114 provides a signal indicative of the amplitude component to the polar amplitude feedback network 116. The polar amplitude feedback network 116 includes a feedback control 116A. In addition to the amplitude component of the output signal 104, the feedback control 116A also receives a signal 106 representing the amplitude component of the original input waveform. Based on these two signals, the feedback control 116A generates a polar amplitude feedback control signal and provides this signal to the amplitude modulator 110. The amplitude modulator 110 uses the polar amplitude feedback control signal to adjust for any nonlinearities in the amplified output signal 104.

The incoming RF signal 102 may already be partially modulated before reaching the amplitude modulator 110. For example, the incoming RF signal 102 may have been modulated previously using phase information from the original waveform. Alternatively, the incoming RF signal 102 may have been modulated previously using both phase and amplitude information from the original waveform. Examples of these alternatives are described in more detail below.

Figure 2:
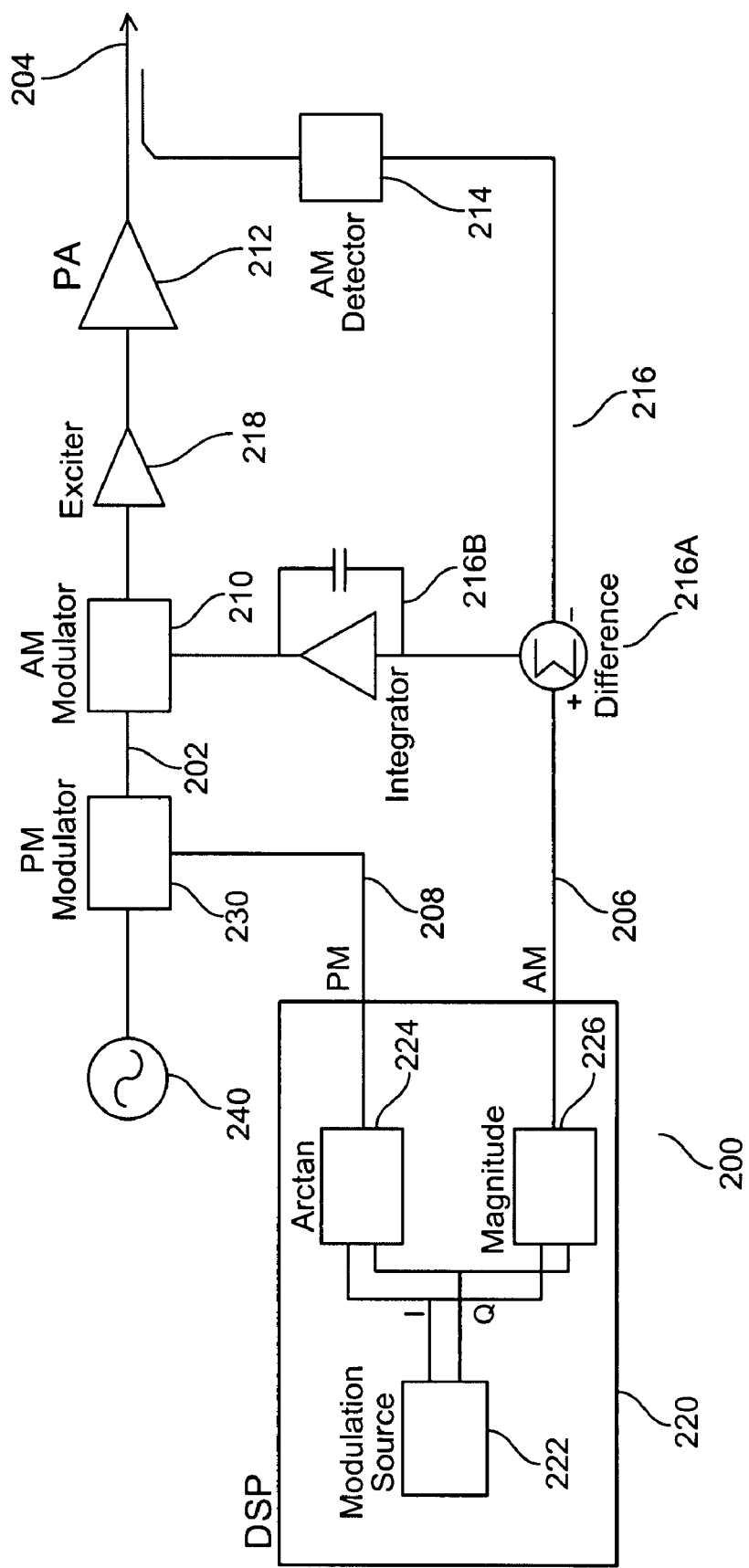
FIG. 2 is a block diagram illustrating a system for power amplification of an RF signal using polar feedback and including a phase modulator according to another aspect of the invention.

FIG. 2 is a block diagram illustrating a system 200 for power amplification of an RF signal using polar amplitude feedback according to another aspect of the invention. Like the system 100 illustrated in FIG. 1, the amplification system 200 of FIG. 2 includes an amplitude modulator 210, a power amplifier 212, an amplitude detector 214, and a polar amplitude feedback network 216. The system 200 also includes a digital signal processor (DSP) 220 and a phase modulator 230. The DSP 220 provides the original waveform in IQ format via a modulation source 222. The DSP also includes arctangent and magnitude functions 224, 226 that isolate the polar phase and magnitude components, respectively, of the original IQ waveform. Based on the output from these functions, the DSP 220 generates a phase component signal 208 and an amplitude component signal 206.

The phase modulator 230 receives the phase component signal 208 and modulates an RF carrier signal based on the phase component signal 208 to generate a partially-modulated RF signal. An RF carrier source 240 generates the underlying RF carrier signal. In the system illustrated in FIG. 2, the partially-modulated RF signal is phase modulated, but not yet amplitude modulated. The amplitude modulator 210 amplitude-modulates the partially-modulated RF signal based on a feedback control signal received from the polar amplitude feedback network 216. The resulting completely-modulated RF signal is sent through the exciter 218 to the power amplifier 212 for amplification as an output signal.

As in the system 100 shown in FIG. 1, the system 200 includes an amplitude detector 214, which senses the amplitude component of the output signal 104 independent of any phase component. The amplitude detector 214 provides a signal indicative of the amplitude component to the polar amplitude feedback network 216. The polar amplitude feedback network 216 includes a difference component that generates a polar amplitude feedback control signal based on the difference between the sensed amplitude component of the output signal and the amplitude component 206 of the original waveform. The polar amplitude feedback control signal is amplified by a high-gain integrating amplifier 216B and provided to the amplitude modulator 210. The amplitude modulator 210 uses the polar amplitude feedback control signal to adjust for any nonlinearities in the amplified output signal 204.

The amplification system 200 of FIG. 2 provides for simple, efficient linear amplification of an RF signal. Because of the high-gain negative feedback present in this configuration, the system will force the detector output to be virtually identical to the desired amplitude modulated waveform. This use of polar amplitude feedback corrects for any distortion introduced by the amplitude modulators 202, the exciter 218, or the power amplifier 212. This enables efficient operation of the power amplifier 212 closer to saturation without the risk of distortion that normally results from operating an amplifier near saturation in an open-loop system. In addition, the components required for the polar amplitude feedback network 216 are relatively simple and inexpensive. However, the phase modulation of the system 200 requires a trade-off for certain applications. Analog phase modulators typically are restricted to +/−180 degrees of phase shift. Many applications require phase shifts larger than +/−180 degrees. An alternative configuration is to use a frequency modulator, as shown in FIG. 3.

Figure 3:
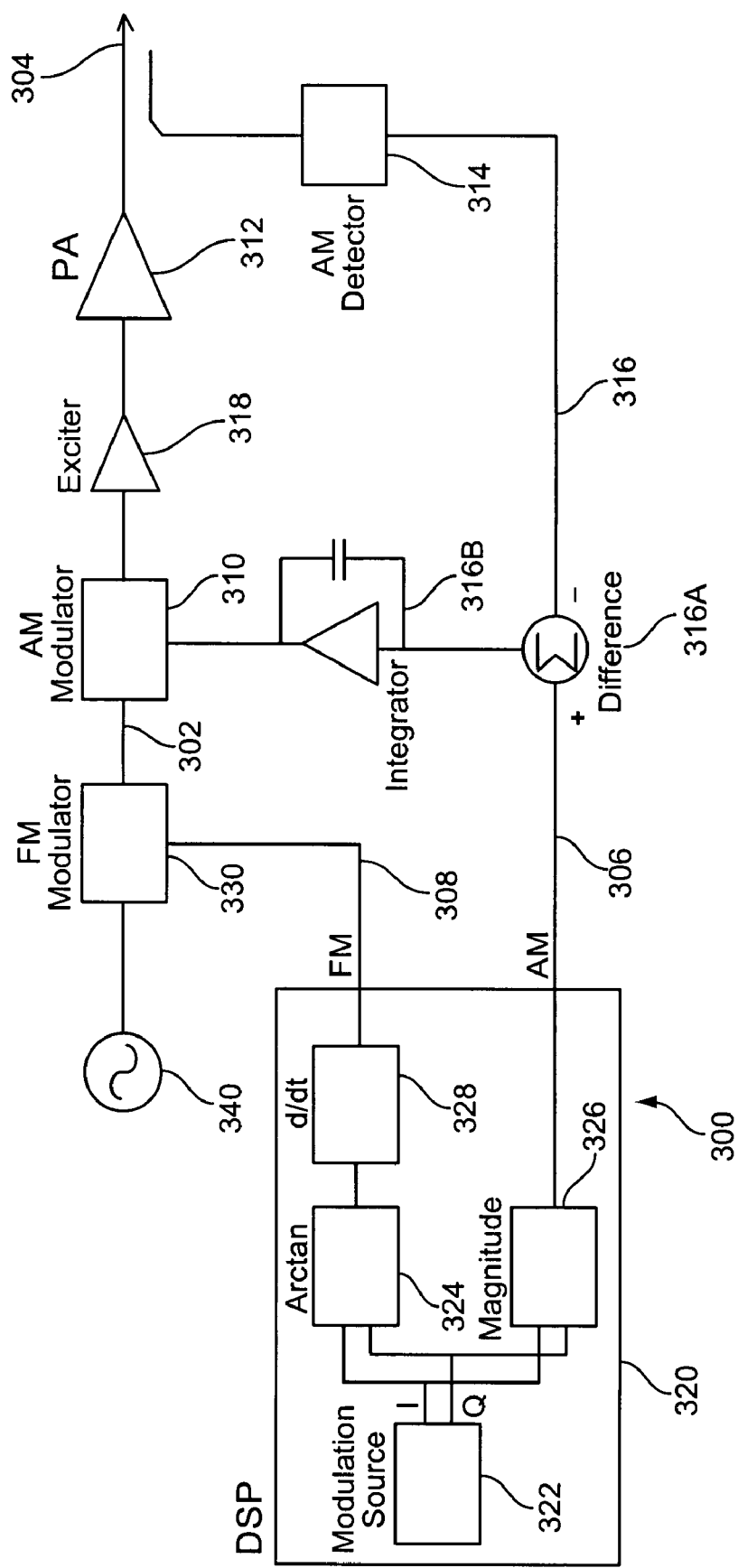
FIG. 3 is a block diagram illustrating a system for power amplification of an RF signal using polar feedback and including a frequency modulator according to another aspect of the invention.

FIG. 3 is a block diagram illustrating a system 300 for power amplification of an RF signal using polar amplitude feedback according to another aspect of the invention. The system 300 is similar to the system 200 illustrated in FIG. 2, except that the system 300 includes a frequency modulator 330. In addition, the DSP 320 of the system 300 includes a differentiator function 328 that isolates the frequency modulated component of the original waveform. Based on the output of this function, the DSP 320 generates a frequency component signal 308, which is passed to the frequency modulator 330. The frequency modulator 330 modulates the RF carrier signal based on the frequency component signal 308 to generate a partially-modulated RF signal 302. The partially-modulated RF signal 302 is passed to the amplitude modulator 310 for polar feedback-controlled amplitude modulation and amplification, as discussed above with respect to FIG. 2.

The system 300 shown in FIG. 3 includes all of the advantages of the system 200 of FIG. 2, and it is not restricted to phase shifts of less than +/−180 degrees. However, the frequency processing and modulation required by the system 300 may present challenges for certain applications. The differentiation function 328 required to generate the frequency component signal generally uses a finite differential to perform an approximation of the differentiation. This results in a time delay between the amplitude signal component 306 and the frequency component signal 308. This time delay can cause distortion in the output signal 304. Degradations in the signal can be alleviated by performing the differentiation at a very high sample rate to minimize the time delay. However, this process may require excessive processor power and/or speed.

Figure 4:
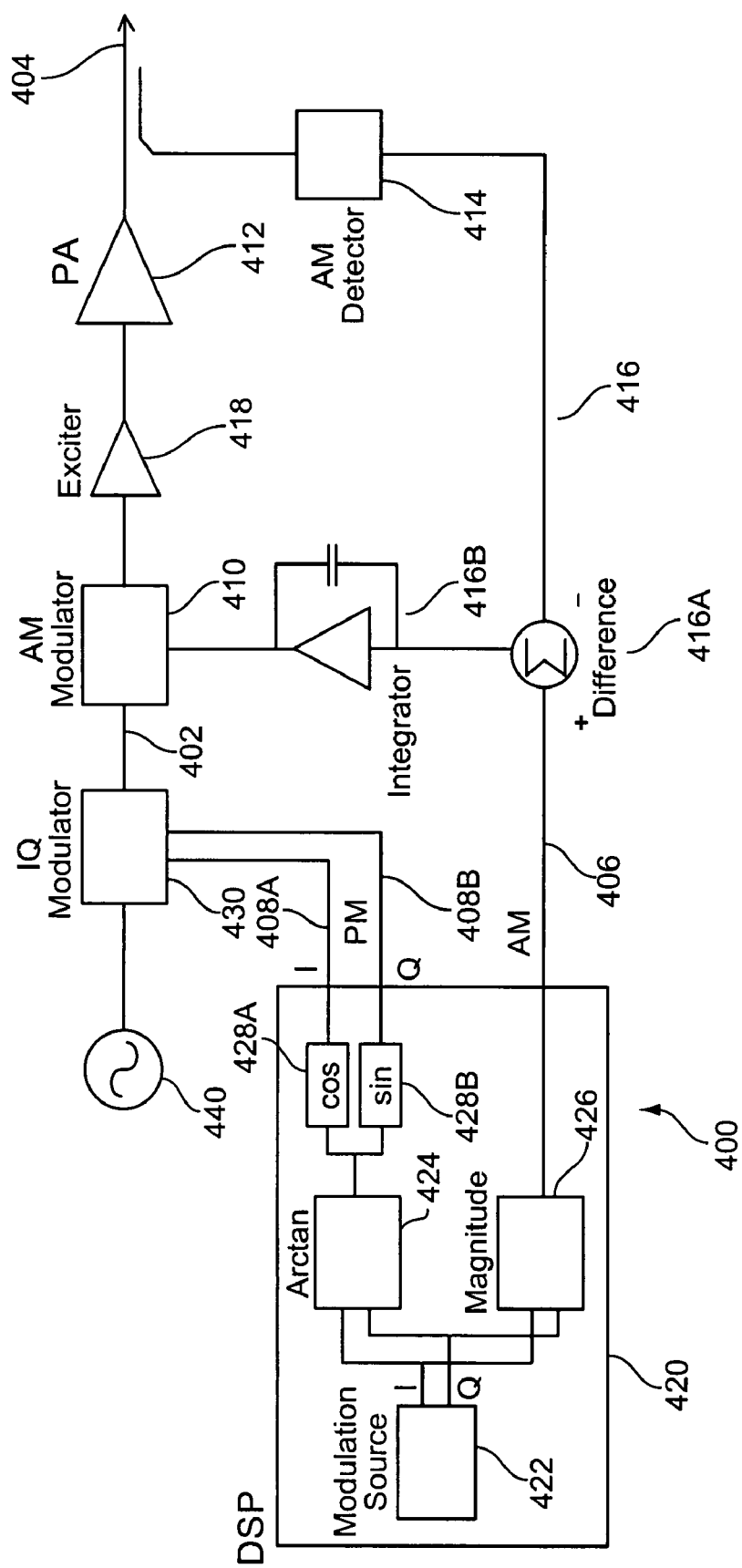
FIG. 4 is a block diagram illustrating a system for power amplification of an RF signal using polar feedback and including an IQ modulator for three-channel signaling according to another aspect of the invention.

As an alternative to the phase and frequency modulators discussed above, an IQ modulator may be used to perform the initial RF modulation. For example, FIG. 4 is a block diagram illustrating a system 400 for power amplification of an RF signal using polar amplitude feedback according to another aspect of the invention. The system 400 shown in FIG. 4 is similar to the systems 200, 300 of FIGS. 2 and 3, except the system 400 includes an IQ modulator 430 in place of a phase/frequency modulator. In addition, the DSP 420 of the system 400 includes cosine 428A and sine 428B functions, which receive a phase component signal from the arctangent function 424. The cosine 428A and sine 428B functions decompose the phase component signal into constant-amplitude in-phase 408A and quadrature 408B component signals. These constant-amplitude IQ signals 408A, 408B are passed to the IQ modulator 430, which used them to modulate the RF carrier signal. The IQ modulator 430 produces a partially-modulated RF signal 402, which is passed to the amplitude modulator 410. In effect, the partially-modulated RF signal 402 is phase-modulated because it does not include any of the amplitude information from the original waveform. As with the system described above, the amplitude information is added via the amplitude modulator 410 and the polar amplitude feedback control network 416. The polar amplitude feedback network 416 provides the same advantages of simple, efficient linear amplification described above.

The system 400 shown in FIG. 4 uses three-channel signaling to avoid the limitations of the phase and frequency modulation schemes described above. The first of the three channels is polar amplitude. The other two channels are the in-phase and quadrature components of the polar phase. This three-channel approach permits unlimited phase shifts and avoids the delays caused by the differentiation function required for frequency modulation.

Figure 5:
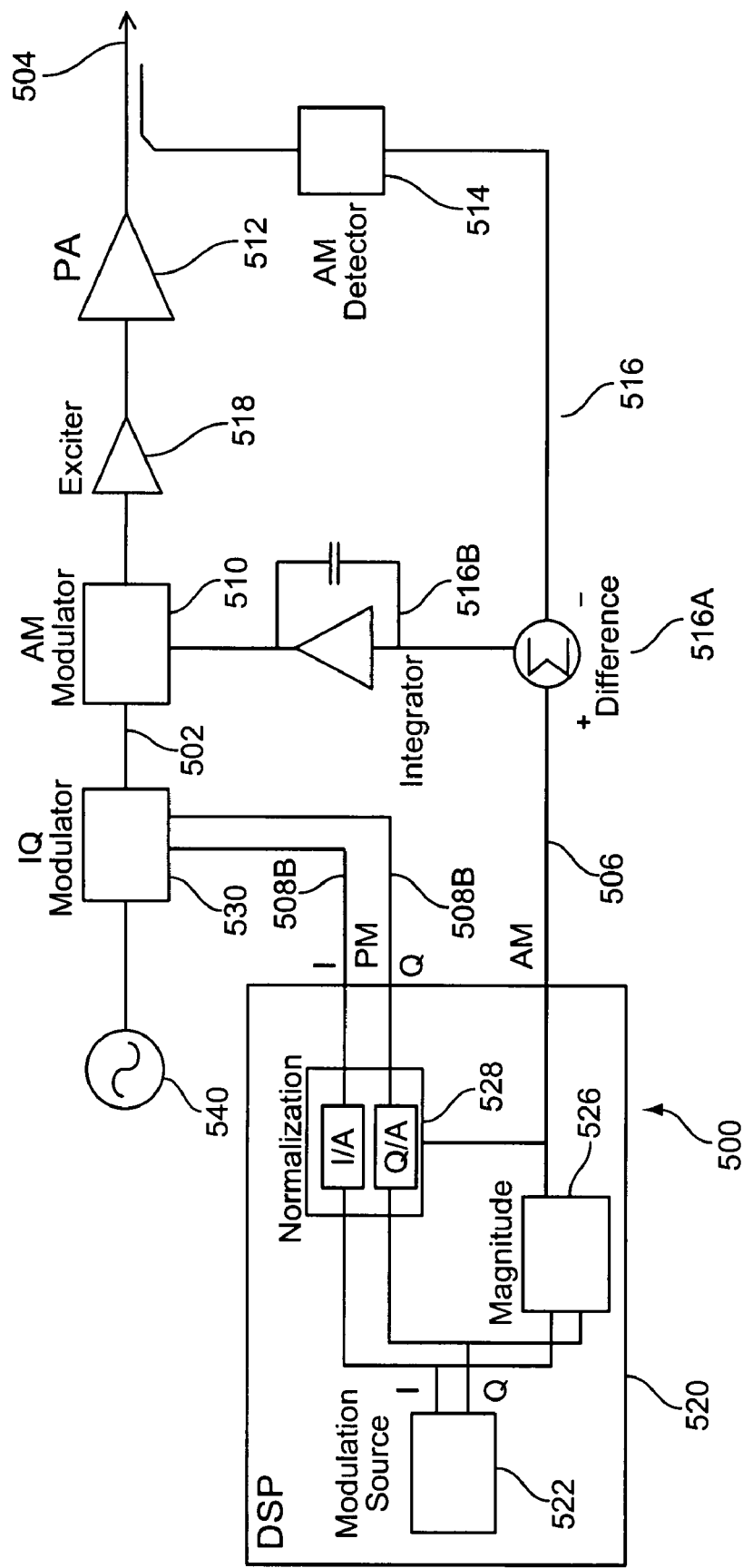
FIG. 5 is a block diagram illustrating a variation of the system illustrated in FIG. 4 according to another aspect of the invention.
Figure 6:
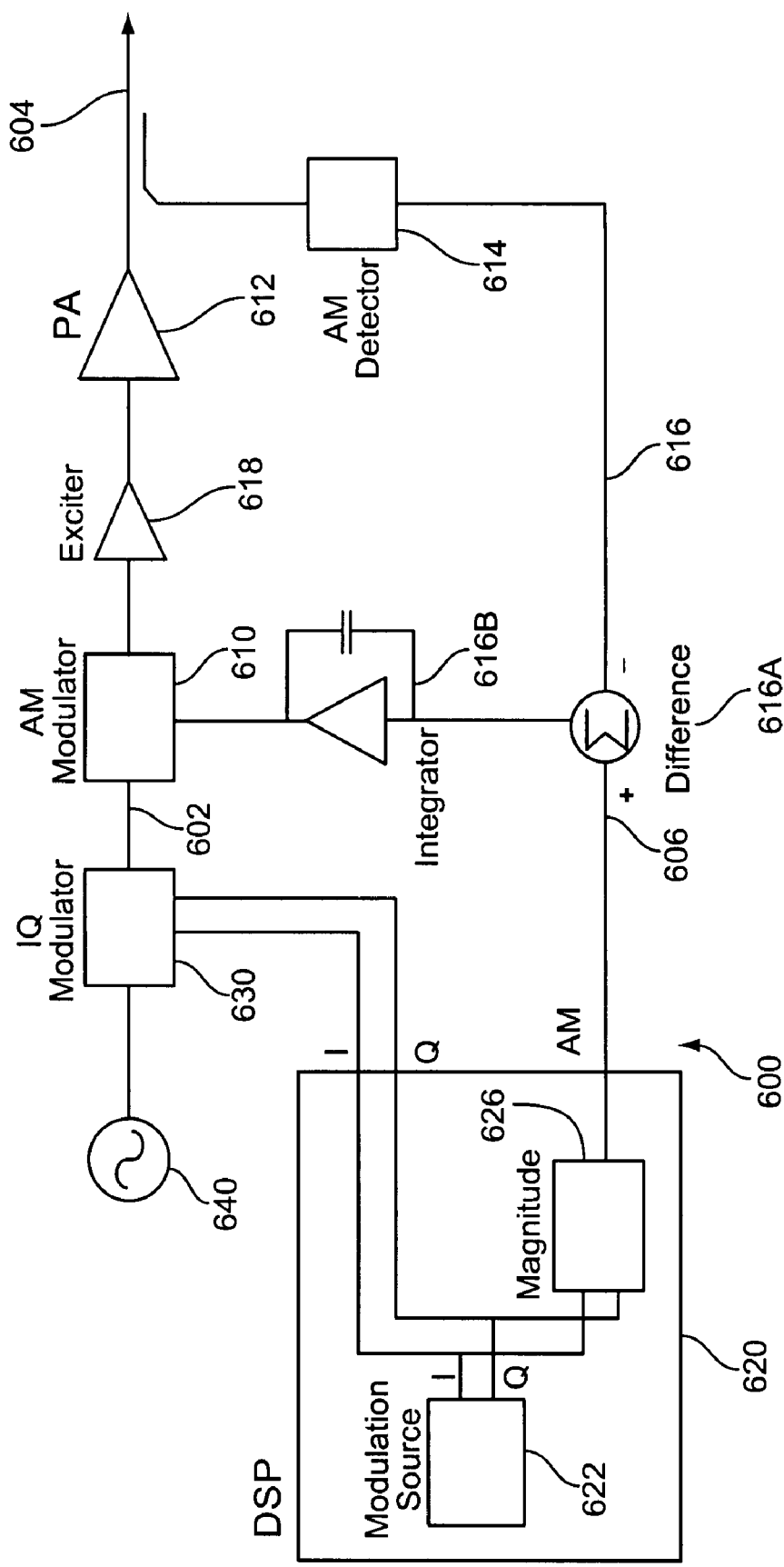
FIG. 6 is a block diagram illustrating another variation of the system illustrated in FIG. 4 according to another aspect of the invention.

FIGS. 5 and 6 illustrate variations on the system 400 shown in FIG. 4. In place of arctangent, cosine, and sine functions, the DSP 520 of the system 500 shown in FIG. 5 includes a normalization function 528. The normalization function 528 divides the IQ signals of the original waveform by the polar amplitude to isolate the in-phase 508A and quadrature 508B components of the polar phase. These signals 508A, 508B are provided to the IQ modulator 530, and the remainder of the system 500 operates just like the system 400 shown in FIG. 4.

The system 600 of FIG. 6 is similar, but lacks the normalization function 528. In this system 600, the IQ signals of the original waveform are provided directly to the IQ modulator 630. As a result, the IQ modulator 630 modulates the RF carrier signal based on both the amplitude and phase of the original waveform and passes the resulting modulated RF signal 602 to the amplitude modulator 610. One advantage of this system 600 is that the DSP 620 is simplified compared to the DSPs 420, 520 shown in FIGS. 4 and 5. Regardless of the presence or absence of the amplitude component at the input of the amplitude modulator 610, the polar amplitude feedback network 616 still forces the system output to be virtually identical to the desired polar amplitude. The remainder of the system 600 operates just like the systems 400, 500 shown in FIGS. 4 and 5.

Figure 7:
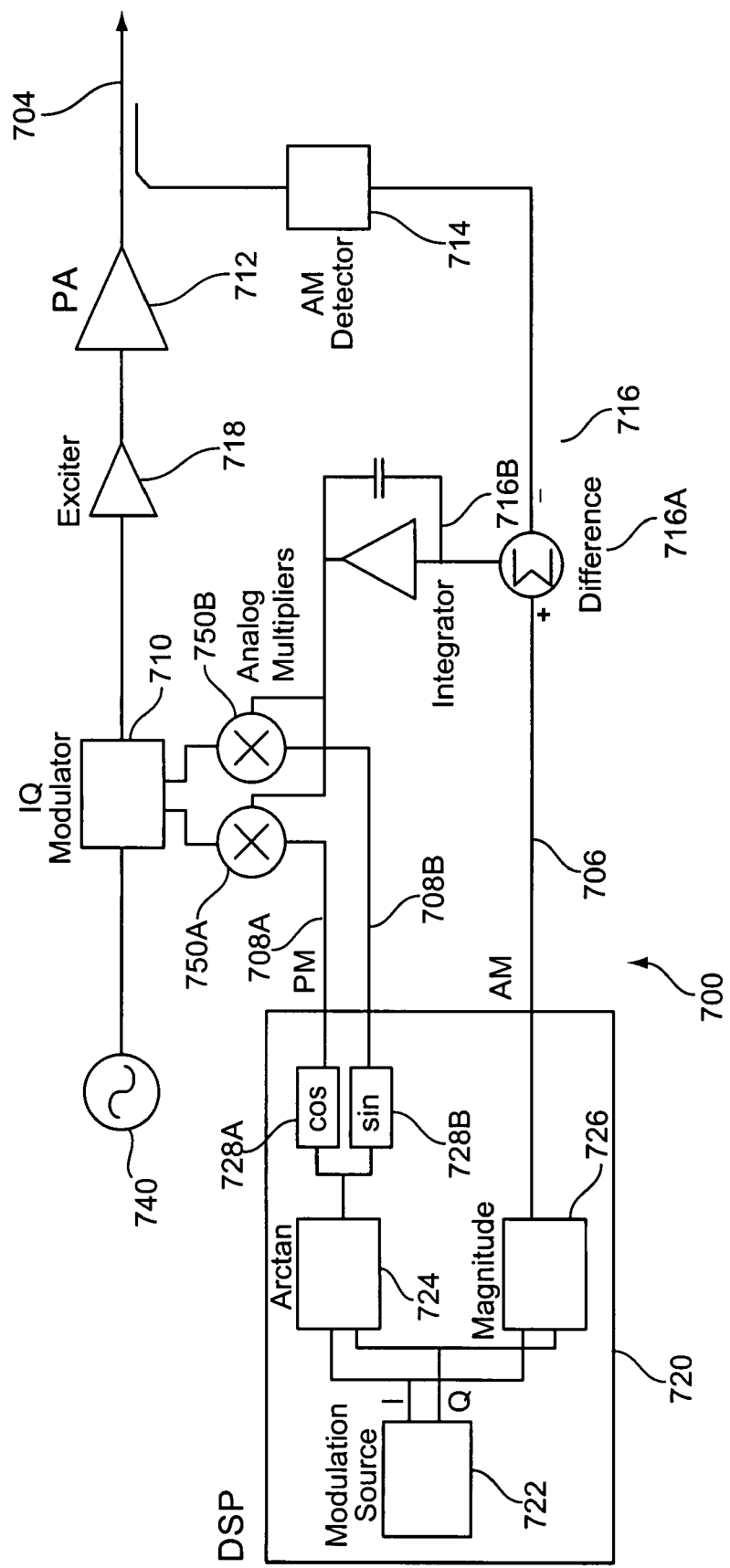
FIG. 7 is a block diagram illustrating a system for power amplification of an RF signal using polar feedback and including a single modulator according to another aspect of the invention.

Another alternative to the systems described above is to combine the functions of the IQ and amplitude modulators. For example, FIG. 7 is a block diagram illustrating a system 700 for power amplification of an RF signal using polar amplitude feedback and including a single modulator 710 according to another aspect of the invention. The system 700 includes a pair of analog multipliers 750A, 750B that are configured to combine the constant-amplitude IQ phase component signals 708A, 708B with the amplitude feedback control signal from the polar amplitude feedback network 716. The combined signals are passed to the single IQ modulator 710 for modulation of the RF carrier signal. The remainder of the system 700, including the power amplifier 712, amplitude detector 714, and DSP 720, operate in a manner similar to the systems described above.

Figure 8:
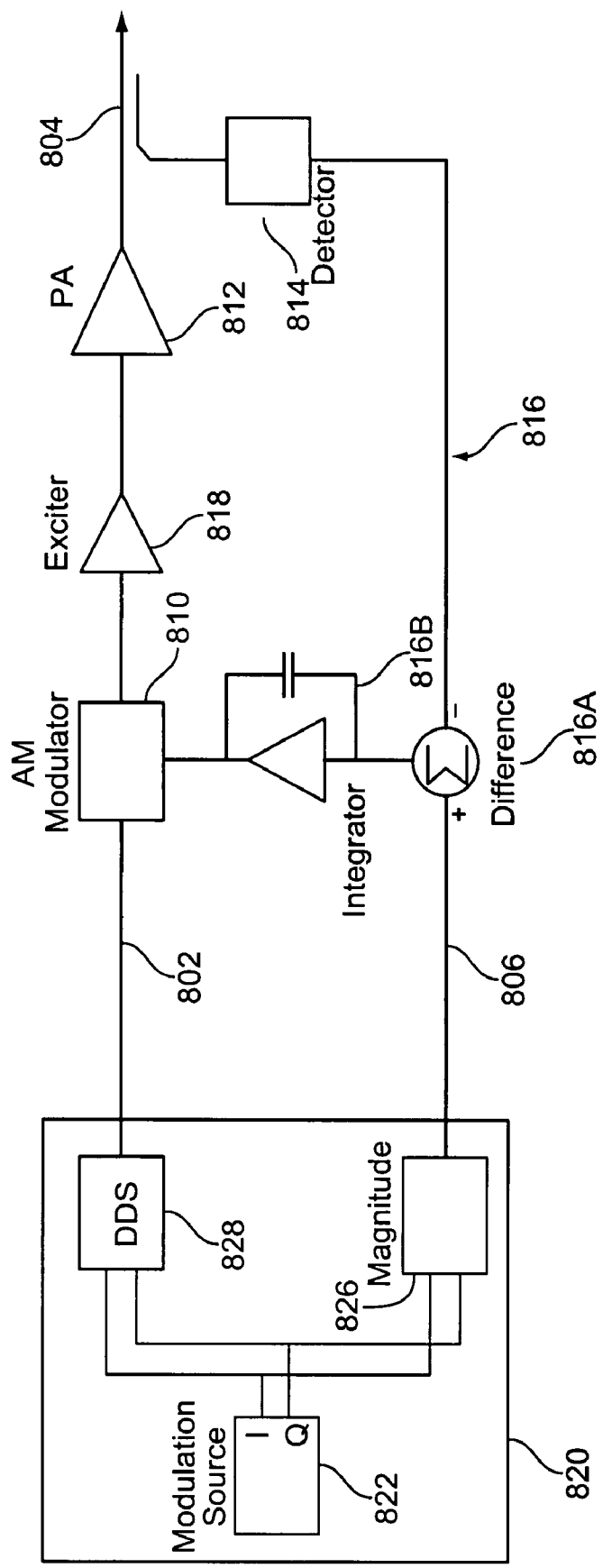
FIG. 8 is a block diagram illustrating a system for power amplification of an RF signal using polar feedback and including direct digital synthesis according to another aspect of the invention.

Yet another alternative amplification system, shown in FIG. 8, employs direct digital synthesis in place of the initial phase modulation. The DSP 828 includes a direct digital synthesis function 828 configured to synthesize the modulated RF signal 802 directly based on the IQ signals of the original waveform. The remainder of the system, including the amplitude modulator 810, exciter 818, power amplifier 812, amplitude detector 814, and polar amplitude feedback network 816, operate in a manner similar to that described above with respect to FIGS. 2-6.

In all of the systems described above, the polar amplitude feedback forces the output of the amplitude detector to be virtually identical to the desired amplitude output. If the amplitude detector itself is linear, then the detector input and output will be proportional to each other, which means that the system output is virtually identical to the desired amplitude output. However, any nonlinearity introduced by the amplitude detector will cause the system output to be distorted by an equal and opposite amount. As a result, it generally is desirable to use a linear detector.

Very linear diode-based amplitude detectors are available and are suitable for use with the systems described here. In general, however, synchronous amplitude detectors are more linear than typical diode detectors. IQ demodulators (also known as quadrature demodulators) typically are composed of two synchronous detectors, one with in-phase oscillator injection, and the other with quadrature oscillator injection. The I-channel of such a demodulator will provide amplitude detection as shown in FIG. 9.

Figure 9:
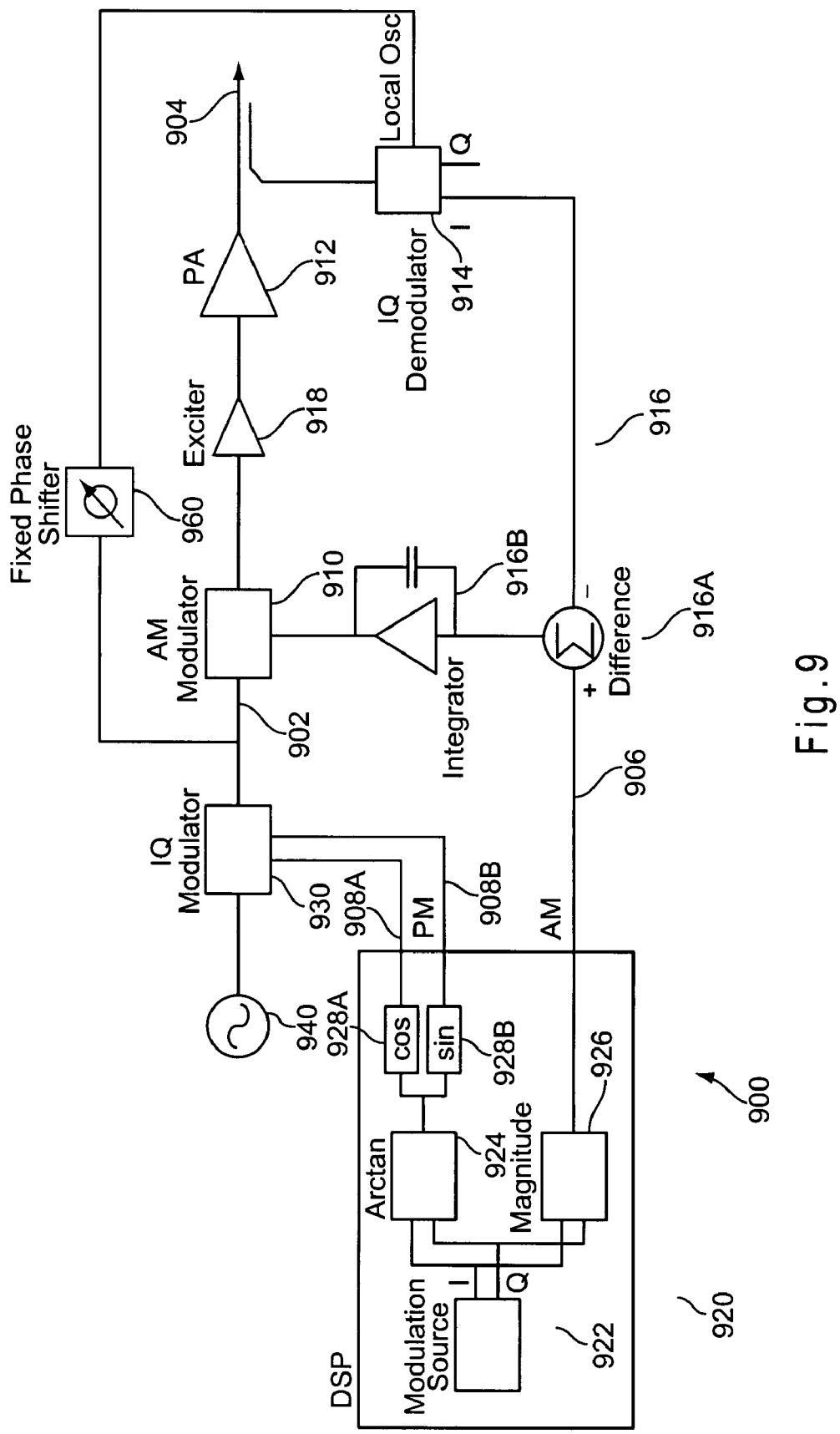
FIG. 9 is a block diagram illustrating a system for power amplification of an RF signal using polar feedback and including amplitude detection using an IQ demodulator according to another aspect of the invention.

FIG. 9 is a block diagram illustrating a system 900 for power amplification of an RF signal using polar amplitude feedback and including amplitude detection using an IQ demodulator 914 according to another aspect of the invention. In addition to the IQ demodulator 914, the system 900 also includes a fixed phase shifter 960. The fixed phase shifter 960 is configured to receive the phase-modulated RF signal 902 from the IQ modulator 930 and to synchronize the phase of the IQ modulator 930 and the local oscillator of the IQ demodulator 914. Because the local oscillator of the IQ demodulator 914 is derived after phase modulation by the IQ modulator 930, the local oscillator will track the phase of the amplified RF output signal 904.

The I-channel output of the IQ demodulator 914 is proportional to $A*\cos(\theta)$, where A is the amplitude of the demodulator's input, and $\theta$ is the phase of the demodulator's input referenced to the phase of its local oscillator. Because of the phase tracking described above, $\theta=0$, so $\cos(\theta)=1$. As a result, the I-channel output is proportional to A, the amplitude of the input. In this way, the I-channel of the demodulator 914 provides an effective amplitude feedback signal for the polar amplitude feedback network 916. The remainder of the system 900 of FIG. 9, including the DSP 920, IQ modulator 930, amplitude modulator 910, exciter 918, and power amplifier 912, operates in a manner similar to that described above with reference to FIG. 4.

The I-channel of the IQ demodulator 914 provides pure amplitude detection only if there is no phase distortion introduced by the exciter 918 and the power amplifier 912. If either of these components introduce phase distortion, then $\theta \neq 0$, and the I-channel of the IQ demodulator 914 will not reflect purely the amplitude component of the amplified RF output signal 904. On the other hand, if the total phase distortion is small, then $\theta$ will remain small and $\cos(\theta) \approx 1$.

Figure 10:
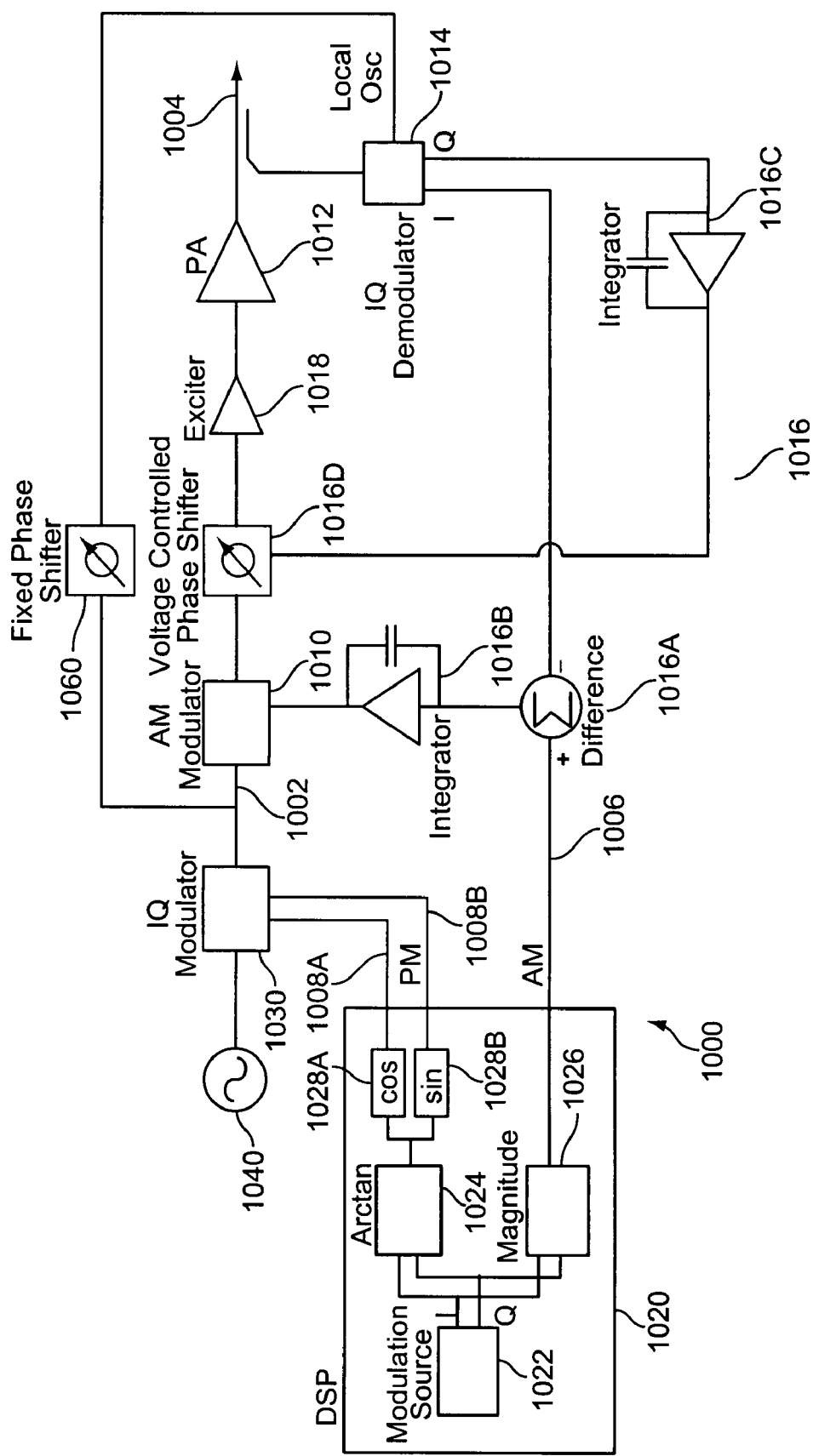
FIG. 10 is a block diagram illustrating a system for power amplification of an RF signal using polar feedback and including amplitude and phase detection using an IQ demodulator according to another aspect of the invention.

To ensure that $\theta=0$, the system 900 of FIG. 9 may be modified to include full polar feedback, including polar phase feedback. For example, FIG. 10 is a block diagram illustrating a system 1000 for power amplification of an RF signal using full polar feedback and including amplitude and phase detection using an IQ demodulator 1014 according to another aspect of the invention. The Q-channel output of the IQ demodulator 1014 is proportional to $A*\sin(\theta)$. This output equals zero as long as $\theta=0$. For small angles, however, $\sin(\theta) \approx \theta$, so the Q-channel output is proportional to $\theta$ for small angles. As a result, the Q-channel output effectively serves as a phase detector, representing the phase of the amplified RF output signal 1004 relative to the phase of the local oscillator signal. This enables the Q-channel output to serve as a polar phase feedback signal.

After amplification by an integrating amplifier 1016C, the polar phase feedback signal provided by the Q-channel output is used to control a voltage-controlled phase shifter 1016D. Because of the negative feedback, the phase portion of the full polar feedback network 1016 will force the Q-channel output of the IQ demodulator to be zero. In this scheme, the integrating amplifier 1016C causes the voltage-controlled phase shifter 1016D to counter any excess phase introduced by the exciter 1018 or the power amplifier 1012. This provides the added advantage of eliminating any phase distortion that may result from the exciter 1018 and/or the power amplifier 1012. In the process, $\theta$ also is forced to zero, which ensures that the I-channel output of the IQ demodulator accurately tracks the amplitude of the amplified RF output signal 1004. The remaining components of the system 1000 operate in a manner similar to that described above with respect to FIGS. 4 and 9.

Variations on the IQ demodulators 914, 1014 and polar feedback networks 916, 1016 shown in FIGS. 9 and 10 provide various possibilities for polar phase and/or amplitude feedback. For example, the phase components 1016C, 1016D of the full polar feedback network 1016 may be used independent of the amplitude components 1016A, 1016B. Conversely, the amplitude components 1016A, 1016B of the full polar feedback network 1016 may be used independent of the phase components 1016C, 1016D (as illustrated in FIG. 9). The amplitude only feedback network is particularly effective when the exciter 1018 and the power amplifier 1012 introduce little or no phase distortion (i.e., $\theta$ is small and $\cos(\theta) \approx 1$). If phase distortion from either or both of these components is significant, the complete polar amplitude and phase feedback network 1016 may be employed. Alternatively, a linear diode-based amplitude detector may be used in place of the IQ demodulator 1014 and without the phase components 1016C, 1016D of the full polar feedback network 1016.

The use of a full polar feedback network 1016 provides various advantages compared to traditional Cartesian feedback networks. For example, the polar phase and amplitude feedback loops are independent and may be operated together or separately. In a traditional Cartesian feedback network, the I and Q feedback loops are interdependent and cannot be independently omitted or disabled. In addition, the phase $\theta$ of the IQ demodulator 1014 shown in FIG. 10 is set automatically. Cartesian feedback schemes require an additional control system to set this phase.

Figure 11:
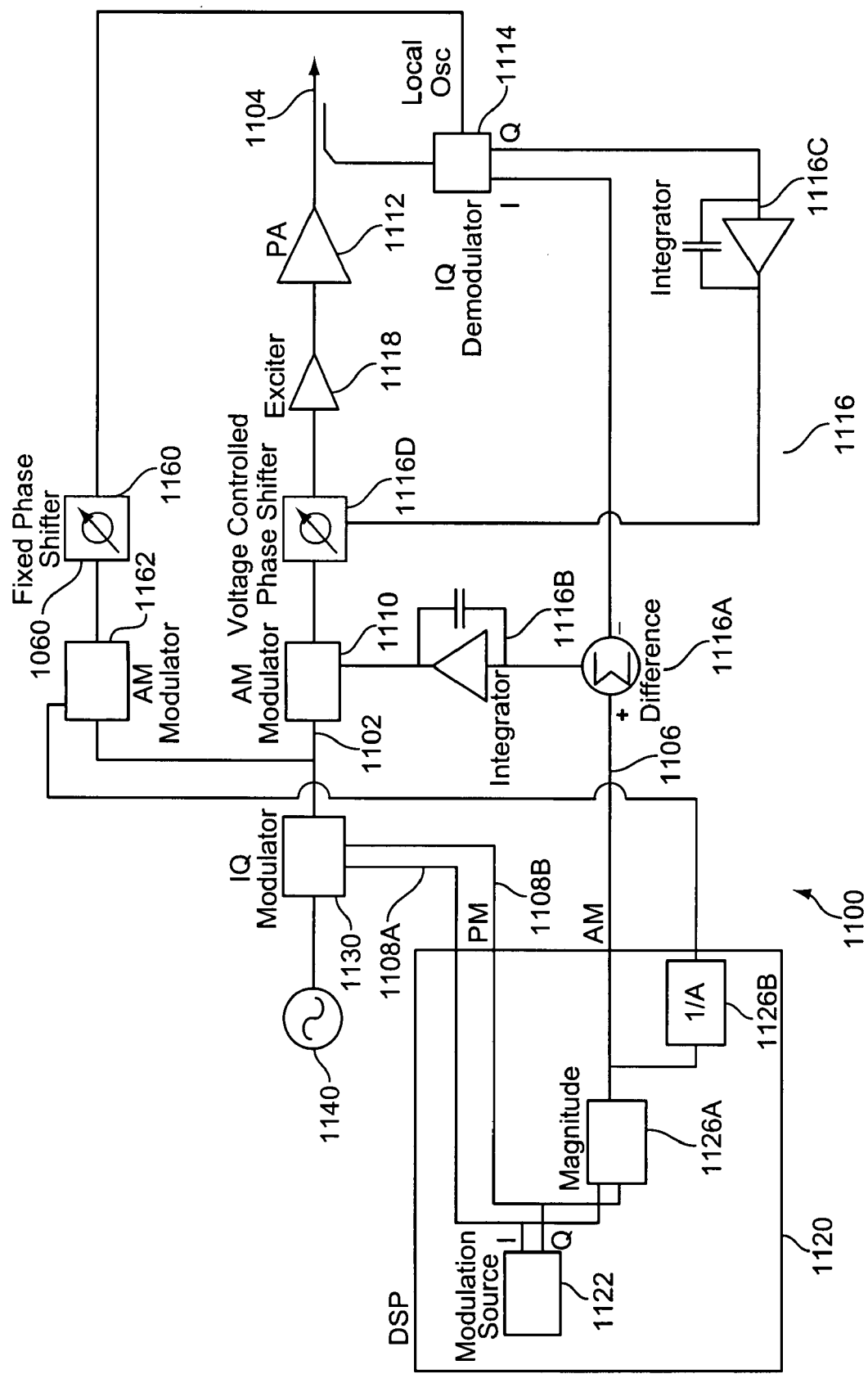
FIG. 11 is a block diagram illustrating a system for power amplification of an RF signal using polar feedback and including amplitude and phase detection using an IQ modulator according to another aspect of the invention.

A full polar feedback network also may be applied to the amplification system 600 shown in FIG. 6. For example, FIG. 11 is a block diagram illustrating a system for power amplification of an RF signal using full polar feedback and including amplitude and phase detection using an IQ modulator according to another aspect of the invention. As with the system 600 of FIG. 6, the DSP 1120 shown in FIG. 11 provides the IQ signals 1108A, 1108B of the original waveform directly to the IQ modulator 1130. In some applications, it may be undesirable for the local oscillator of the IQ demodulator 1114 to receive an input that includes an amplitude modulation component. To avoid this, the system 1100 may be configured to include two additional components. First, the DSP may be configured to include a 1/A function 1126B, which will be used to isolate the phase component by multiplying the signal by the inverse of its amplitude. The output of this function 1126B may then be used to control the second additional component, the amplitude modulator 1162. Together, these two components 1126A, 1162 eliminate the amplitude modulation component from the input to the fixed phase shifter 1160. As a result, the input to the local oscillator of the IQ demodulator 1114 is free of amplitude modulation. The remaining components shown in FIG. 11 operate in a manner similar to that described above with reference to FIGS. 9 and 10.

Figure 12:
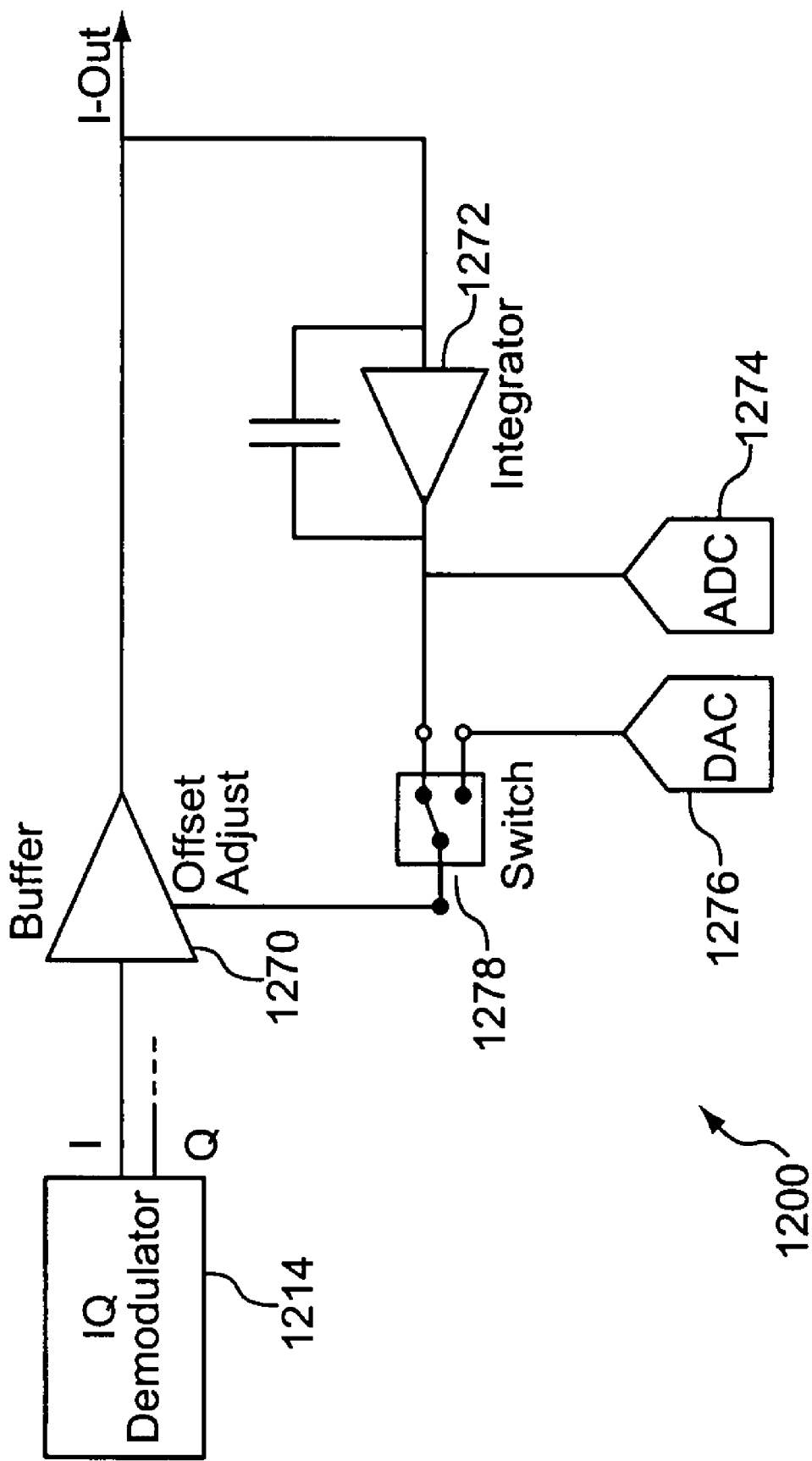
FIG. 12 is a block diagram illustrating a circuit for nulling an offset adjustment of a demodulator output buffer according to another aspect of the invention.

Some types of amplitude modulators experience excessive levels of carrier leakage. In addition, certain IQ demodulators experience excessive DC offset levels. To address these issues, a nulling circuit may be used in applications and situations in which leakage and/or offset presents a problem. For example, FIG. 12 is a block diagram illustrating a circuit 1200 for nulling an offset adjustment of a demodulator output buffer according to another aspect of the invention. The circuit 1200 includes a buffer 1270 for the I-channel output of an IQ demodulator 1214. The circuit 1200 may be duplicated for the Q-channel output of the IQ demodulator 1214. The buffer 1270 includes an offset-adjust input port that is connected to a two-way switch 1278. The switch 1278 selectably connects the offset-adjust input port of the buffer 1270 to either the output of a digital-to-analog converter (DAC) 1276 or to the return end of a feedback loop, including an integrating amplifier 1272 connected to an analog-to-digital converter (ADC) 1274. During normal operation, the switch 1278 connects the DAC 1276 output to the offset-adjust input port of the buffer 1270. During a brief calibration period (e.g., <<1 millisecond), the switch is set to close the feedback loop, causing feedback to cancel any offset in the system. During calibration, the ADC 1274 reads the nulling voltage and sends the value to a controller. The controller stores the value and sends it back to the DAC 1276. When the calibration period is over, and the switch reverts to its normal position, the desired nulling voltage is applied to the buffer via the DAC 1276.

Figure 13:
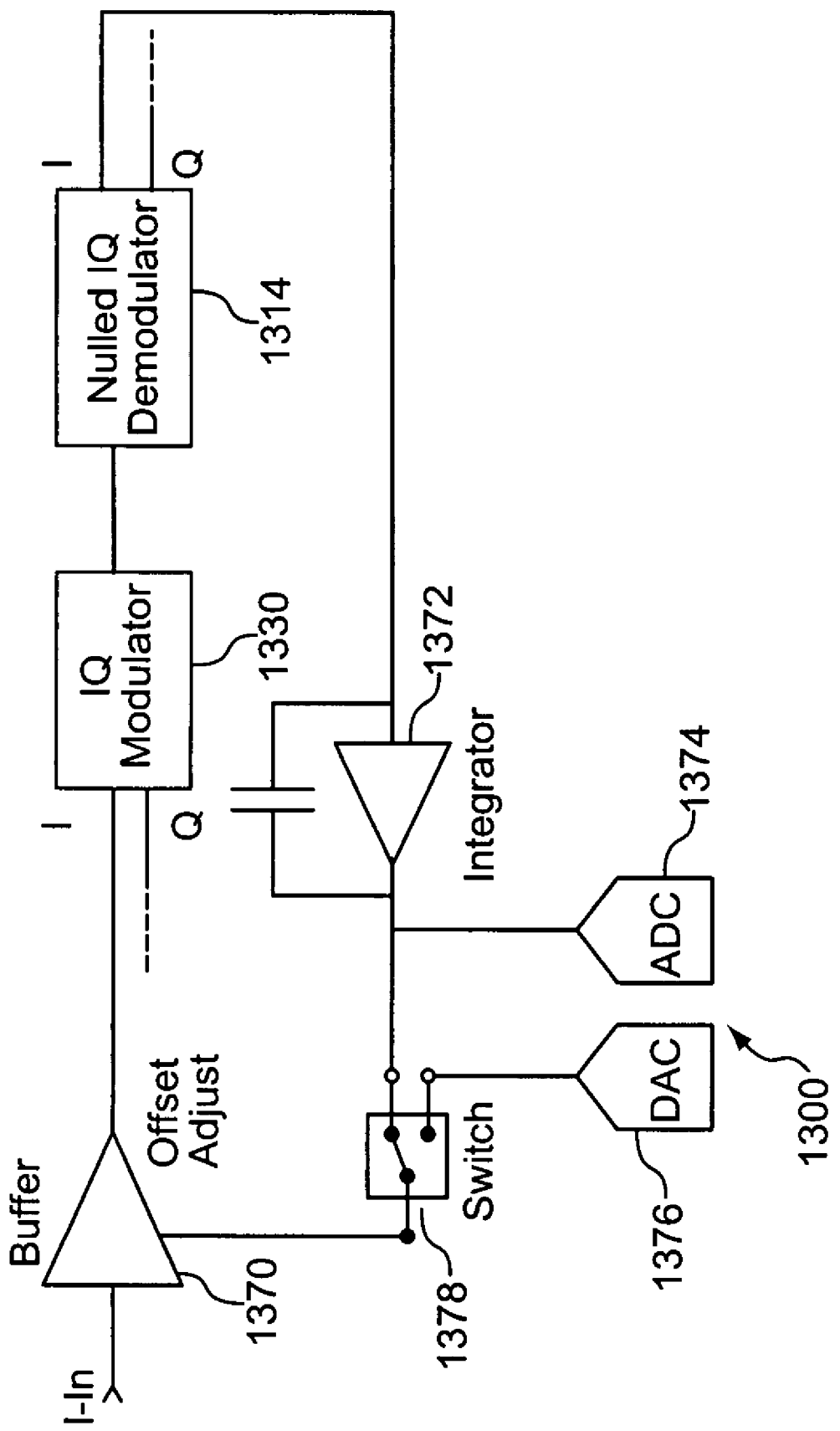
FIG. 13 is a block diagram illustrating a circuit for nulling an offset adjustment of a modulator input buffer according to another aspect of the invention.

Once the IQ demodulator is nulled, a similar scheme can be applied around the modulator-demodulator combination to null any leakage of the modulator. In this case, feedback may be applied to an input buffer that precedes the modulator. For example, FIG. 13 is a block diagram illustrating a circuit 1300 for nulling an offset adjustment of a modulator input buffer according to another aspect of the invention. The circuit 1300 includes a buffer 1370 for the I-channel input of an IQ modulator 1330 paired with a nulled IQ demodulator 1314. The circuit 1300 may be duplicated for the Q-channel input of the IQ modulator 1330. The buffer 1370 includes an offset-adjust input port that is connected to a two-way switch 1378. Operation of the switch 1378 is similar to that of the switch 1278 described above with reference to FIG. 12. The switch 1378 selectably connects the offset-adjust input port of the buffer 1370 to either the output of a digital-to-analog converter (DAC) 1376 or to the return end of a feedback loop from the I-channel output of the nulled IQ demodulator, including an integrating amplifier 1372 connected to an analog-to-digital converter (ADC) 1374. During normal operation, the switch connects the DAC output to the offset-adjust input port of the buffer 1370. During a brief calibration period (e.g., <<1 millisecond), the switch is set to close the feedback loop, causing feedback to eliminate any leakage in the system. During calibration, the ADC 1374 reads the nulling voltage and sends the value to a controller. The controller stores the value and sends it back to the DAC 1376. When the calibration period is over, and the switch 1378 reverts to its normal position, the desired nulling voltage is applied to the buffer via the DAC 1376.

The nulling circuits 1200, 1300 shown in FIGS. 12 and 13 can utilize periodic calibration, depending on how long the modulator/demodulator remains nulled in the normal (i.e., open-loop) mode. For example, if temperature and operation are always consistent, then calibration theoretically may be required only once. Realistically, it usually will be necessary to calibrate the nulling circuits more frequently (e.g., once per hour, once per day, or each time the amplifier/transmitter is turned on).

The methods and systems of the present invention may be realized in software, hardware, or a combination of software and hardware. For example, a typical combination of software and hardware may be a DSP with a program that controls the DSP to perform the functions described herein. Any type of computing system or other apparatus adapted for realizing the functions described herein is suitable. In the present context, a program may include any expression, in any language, code or notation, of a set of instructions intended to cause a system having an information processing capability to perform a particular function.

It is intended that the foregoing detailed description be regarded as illustrative rather than limiting, and that it be understood that the following claims, including all equivalents, are intended to define the scope of this invention. One of ordinary skill in the art will recognize that variations on the systems and methods described herein may be made within the scope of the as will be apparent to those reasonably skilled in the art.

The invention claimed is:

1. A system for power amplification of a partially modulated radio-frequency (RF) signal representative of at least a phase component of an original waveform, the system comprising:
   a feedback-controlled modulator configured to modulate the partially modulated RF signal based upon a feedback-corrected control signal and to generate a modulated RF signal;
   a power amplifier coupled to the feedback-controlled modulator and configured to amplify the modulated RF signal and to generate an amplified RF output signal;
   an amplitude detector coupled to the power amplifier and configured to detect an amplitude characteristic of the amplified RF output signal and to generate an amplitude feedback signal;
   a feedback network coupled to the amplitude detector and the feedback-controlled modulator and configured to generate the feedback-corrected control signal based upon a difference between the amplitude feedback signal and an amplitude component of the original waveform; and
   an IQ modulator configured to modulate an RF carrier signal based upon a pair of IQ signals representative of at least the phase component of the original waveform and to generate the partially modulated RF signal.

2. The system as in claim 1, wherein the feedback-corrected control signal is a feedback-corrected amplitude control signal; and wherein the feedback-controlled modulator is an amplitude modulator configured to amplitude-modulate the partially modulated RE signal based upon the feedback-corrected amplitude control signal and to generate the modulated RF signal.

3. The system of claim 2, wherein the partially modulated RF signal is a phase-modulated RF signal.

4. The system of claim 3, further comprising a fixed phase shifter configured to generate a phase shifted signal based upon a phase characteristic of the phase-modulated RF signal; wherein the amplitude detector further comprises an IQ demodulator coupled to the power amplifier and the fixed phase shifter; wherein the IQ demodulator includes a local oscillator configured to receive the phase shifted signal and to oscillate in phase with the phase-modulated RF signal; and wherein the amplitude feedback signal has an in-phase component signal generated by the IQ demodulator based upon the amplified RF output signal.

5. The system of claim 3, further comprising:
   a phase modulator configured to phase-modulate an RF carrier signal based upon the phase component of the original waveform and to generate the phase-modulated RF signal.

6. The system of claim 5, further comprising:
   a polar signal converter coupled to the phase modulator and the feedback network and configured to receive the original waveform in a rectangular format and to convert the original waveform into the phase component and the amplitude component.

7. The system of claim 1, further comprising a digital signal processor coupled to the IQ modulator and configured to normalize the pair of IQ signals to represent the phase component of the original waveform.

8. The system of claim 1, further comprising:
a polar signal converter configured
to receive the original waveform in a rectangular format,
to convert the original waveform into the phase component and the amplitude component, and
to provide the amplitude component to the feedback network; and
a rectangular signal converter coupled to the polar signal converter and the feedback-controlled modulator and configured to convert the phase component into the pair of IQ signals.

9. The system of claim 8, wherein the polar signal converter and the rectangular signal converter are implemented in a digital signal processor.

10. The system as in claim 1, wherein the feedback-corrected control signal comprises a pair thereof; wherein the feedback-controlled modulator is an IQ modulator; wherein the feedback network includes a pair of analog multipliers configured to generate the pair of feedback-corrected IQ signals based upon the pair of IQ signals representative of at least the phase component of the original waveform, and the difference between the amplitude feedback signal and the amplitude component of the original waveform.

11. A system for power amplification of a partially modulated radio-frequency (RF) signal representative of at least a phase component of an original waveform, the system comprising:
a feedback-controlled amplitude modulator configured to amplitude-modulate the partially modulated RF signal based upon a feedback-corrected amplitude control signal and to generate a modulated RF signal;
a power amplifier coupled to the feedback-controlled amplitude modulator and configured to amplify the modulated RF signal and to generate an amplified RF output signal;
an amplitude detector coupled to the power amplifier and configured to detect an amplitude characteristic of the amplified RF output signal and to generate an amplitude feedback signal;
a feedback network coupled to the amplitude detector and the feedback-controlled amplitude modulator and configured to generate the feedback-corrected amplitude control signal based upon a difference between the amplitude feedback signal and an amplitude component of the original waveform; and
a direct-digital synthesizer coupled to the feedback-controlled amplitude modulator and configured to generate the phase-modulated RF signal based upon the phase component of the original waveform.

12. A system for power amplification of a radio-frequency (RF) signal comprising:
a feedback-controlled IQ modulator configured to modulate the RF signal based upon a pair of feedback-corrected control signals and to generate a modulated RF signal;
a power amplifier coupled to the feedback-controlled IQ modulator and configured to amplify the modulated RF signal and to generate an amplified RF output signal;
an amplitude detector coupled to the power amplifier and configured to detect an amplitude characteristic of the amplified RF output signal and to generate an amplitude feedback signal; and
a feedback network coupled to the amplitude detector and the feedback-controlled IQ modulator and comprising a pair of multipliers configured to generate the pair of feedback-corrected control signals based upon a pair of IQ signals representative of at least a phase component of an original waveform, and a difference between the amplitude feedback signal and an amplitude component of the original waveform.

13. A system for power amplification of a radio-frequency (RF) signal comprising:
a feedback-controlled modulator configured to modulate the RF signal based upon a feedback-corrected control signal and to generate a modulated RF signal;
a power amplifier coupled to the feedback-controlled modulator and configured to amplify the modulated RF signal and to generate an amplified RF output signal;
an amplitude detector coupled to the power amplifier and configured to detect an amplitude characteristic of the amplified RF output signal and to generate an amplitude feedback signal;
a feedback network coupled to the amplitude detector and the feedback-controlled modulator and configured to generate the feedback-corrected control signal based upon a difference between the amplitude feedback signal and an amplitude component of the RF signal; and
a fixed phase shifter configured to generate a phase shifted signal based upon a phase characteristic of a phase-modulated RF signal;
the amplitude detector comprising an IQ demodulator coupled to the power amplifier and the fixed phase shifter, the IQ demodulator including a local oscillator configured to receive the phase shifted signal and to oscillate in phase with the phase-modulated RF signal, the amplitude feedback signal having an in-phase component signal generated by the IQ demodulator based upon the amplified RF output signal.

* * * * *